(12) United States Patent
Kao et al.

(10) Patent No.: US 8,928,078 B2
(45) Date of Patent: Jan. 6, 2015

(54) DOUBLE DIFFUSED METAL OXIDE SEMICONDUCTOR DEVICE AND MANUFACTURING METHOD THEREOF

(71) Applicants: Tzu-Cheng Kao, Hukou Township, Hsinchu County (TW); Jian-Hsing Lee, Puzi (TW); Jin-Lian Su, Kaohsiung (TW); Huan-Ping Chu, Hsinchu (TW); Hung-Der Su, Pingzhen (TW)

(72) Inventors: Tzu-Cheng Kao, Hukou Township, Hsinchu County (TW); Jian-Hsing Lee, Puzi (TW); Jin-Lian Su, Kaohsiung (TW); Huan-Ping Chu, Hsinchu (TW); Hung-Der Su, Pingzhen (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 86 days.

(21) Appl. No.: 13/726,579

(22) Filed: Dec. 25, 2012

(65) Prior Publication Data

US 2014/0175545 A1  Jun. 26, 2014

(51) Int. Cl.
*H01L 29/76* (2006.01)
*H01L 29/94* (2006.01)
*H01L 29/78* (2006.01)
*H01L 29/66* (2006.01)

(52) U.S. Cl.
CPC ...... *H01L 29/7835* (2013.01); *H01L 29/66681* (2013.01)
USPC ........... 257/339; 257/340; 257/341; 257/342; 257/343; 438/286

(58) Field of Classification Search
CPC ............ H01L 29/7816; H01L 29/7835; H01L 29/66681; H01L 29/78; H01L 29/7824
USPC .................................. 257/339–343; 438/286
See application file for complete search history.

(56) References Cited

U.S. PATENT DOCUMENTS

2002/0017697 A1* 2/2002 Kitamura et al. ............. 257/492

* cited by examiner

*Primary Examiner* — Theresa T Doan
(74) *Attorney, Agent, or Firm* — Tung & Associates (57) ABSTRACT

The present invention discloses a double diffused metal oxide semiconductor (DMOS) device and a manufacturing method thereof. The DMOS device includes: a first conductive type substrate, a second conductive type high voltage well, a gate, a first conductive type body region, a second conductive type source, a second conductive type drain, a first conductive type body electrode, and a first conductive type floating region. The floating region is formed in the body region, which is electrically floating and is electrically isolated from the source and the gate, such that the electrostatic discharge (ESD) effect is mitigated.

3 Claims, 8 Drawing Sheets

DOUBLE DIFFUSED METAL OXIDE SEMICONDUCTOR DEVICE AND MANUFACTURING METHOD THEREOF

BACKGROUND OF THE INVENTION

1. Field of Invention

The present invention relates to a double diffused metal oxide semiconductor (DMOS) device and a manufacturing method thereof; particularly, it relates to such DMOS device and manufacturing method thereof wherein electrostatic discharge (ESD) effect is mitigated.

2. Description of Related Art

Figure 1A:
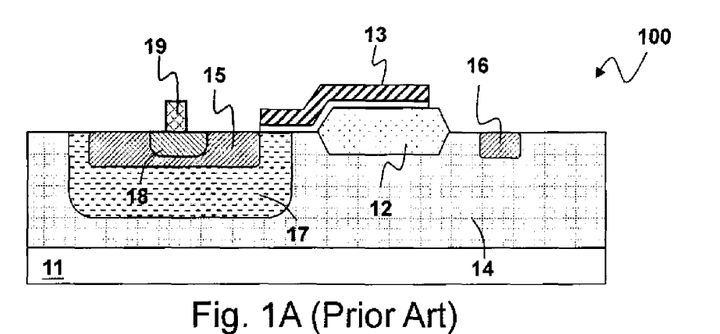
FIGS. 1A-1B show a cross-section view and a top view of a prior art LDMOS device 100 respectively.
Figure 1B:
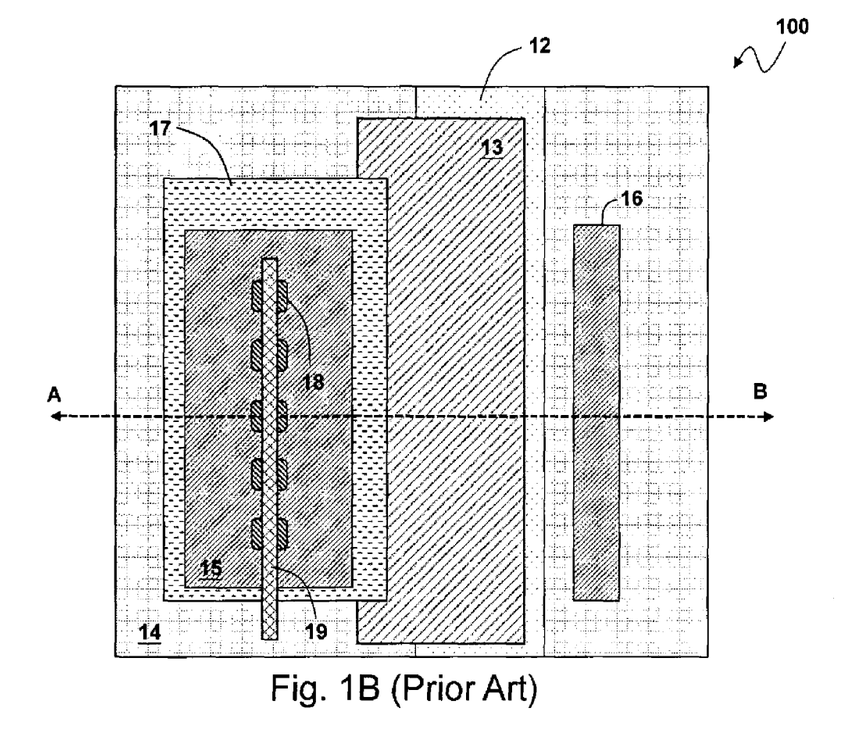
Figure 2A:
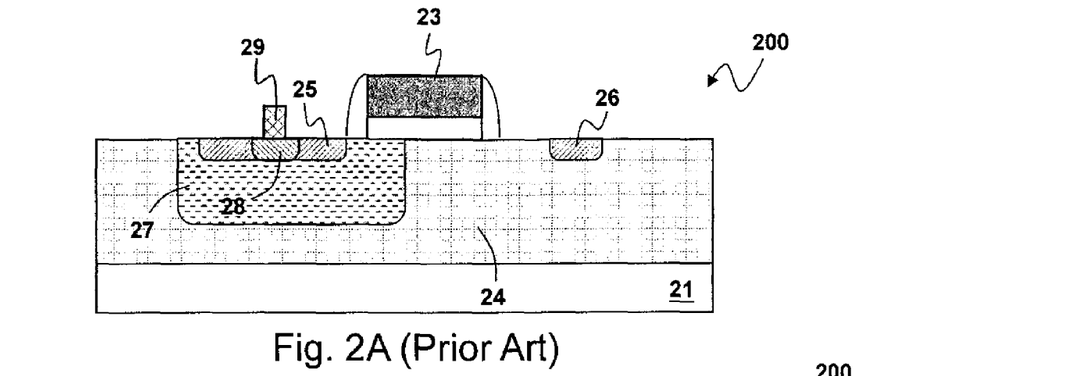
FIGS. 2A-2B show a cross-section view and a top view of a prior art DDDMOS device 200 respectively.
Figure 2B:
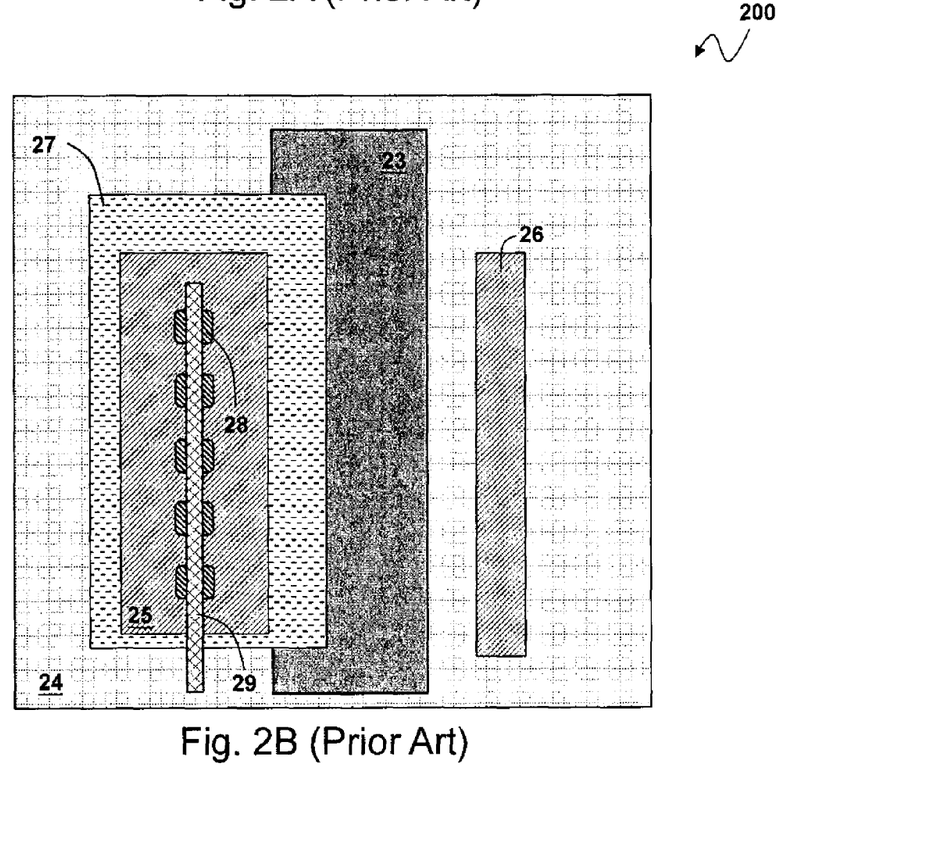

Lateral double diffused metal oxide semiconductor (LDMOS) device and double diffused drain metal oxide semiconductor (DDDMOS) are typical high voltage devices, which are both referred to as DMOS devices. FIGS. 1A-1B show a cross-section view and a top view of a prior art LDMOS device 100 respectively. And FIGS. 2A-2B show a cross-section view and a top view of a prior art DDDMOS device 200 respectively. As shown in FIGS. 1A-1B, a field oxide region 12 is formed in a P-type substrate 11, wherein the field oxide region 12 for example is a shallow trench isolation (STI) structure or a local oxidation of silicon (LOCOS) structure, the latter being shown in FIG. 1A. The LDMOS device 100 includes a gate 13, an N-type high voltage well 14, an N-type source 15, an N-type drain 16, a P-type body region 17, and a P-type body electrode 18. The N-type high voltage well 14, the N-type source 15 and the N-type drain 16 are defined by lithography process steps and formed by ion implantation process steps, wherein the lithography process step defines the implantation region by a photoresist mask together with a self-alignment effect provided by all or part of the gate 13 and the field oxide region 12, and the ion implantation process step implants N-type impurities to the defined region in the form of accelerated ions. The P-type body region 17 and the P-type body electrode 18 are defined by lithography process steps and formed by ion implantation process steps, wherein the lithography process step defines the implantation region by a photoresist mask together with a self-alignment effect provided by all or part of the gate 13 and the field oxide region 12, and the ion implantation process step implants P-type impurities to the defined region in the form of accelerated ions. The source 15 and the drain 16 are below the gate 13 and at different sides thereof respectively. In the LDMOS device 100, part of the gate 13 is located on the field oxide region 12. FIG. 1A is a cross-section taken in a lateral direction along a cross-section line AB indicated in the top view FIG. 1B. Referring to FIG. 1B, in a vertical direction, a conductive layer 19 connects both the source 15 and the body electrode 18, such that the source 15 and the body region 17 are kept at a same voltage level, such as a ground level.

FIGS. 2A-2B show the cross-section view and the top view of the prior art DDDMOS device 200 respectively. The DDDMOS device 200 is different from the aforementioned LDMOS device 100 in that, a gate 23 of the DDDMOS device 200 is entirely on an upper surface of a P-type substrate 21 with no part on a field oxide region. The DDDMOS device 200 includes the gate 23, an N-type high voltage well 24, an N-type source 25, an N-type drain 26, a P-type body region 27, and a P-type body electrode 28. The N-type high voltage well 24, the N-type source 25 and the N-type drain 26 are defined by lithography process steps and formed by ion implantation process steps, wherein the lithography process step defines the implantation region by a photoresist mask together with a self-alignment effect provided by all or part of the gate 23, and the ion implantation process step implants N-type impurities to the defined region in the form of accelerated ions. The P-type body region 27 and the P-type body electrode 28 are defined by lithography process steps and formed by ion implantation process steps, wherein the lithography process step defines the implantation region by a photoresist mask together with a self-alignment effect provided by all or part of the gate 23, and the ion implantation process step implants P-type impurities to the defined region in the form of accelerated ions. The source 25 and the drain 26 are below the gate 23 and at different sides thereof respectively. Referring to FIG. 2B, in a vertical direction, a conductive layer 29 connects both the source 25 and the body electrode 28, such that the source 25 and the body region 27 are kept at a same voltage level, such as the ground level.

The LDMOS and DDDMOS devices are DMOS devices. In general applications such as in an ESD test or actual operation, when the drain is electrically connected to a high voltage, especially an electrostatic voltage with a relatively high level, a very high electric field is formed at the end of the DMOS device, and the lateral channel between the source and the drain at the end of the DMOS device in the vertical direction often is not fully conductive, so a breakdown usually occurs at an end of the DMOS device in the vertical direction, which may damage the DMOS device. The prior art DMOS devices have limited capability of sustaining the ESD, and the application range of the DMOS devices is limited, because the end of the DMOS device in the vertical direction can not sustain the high electrostatic voltage and tends to breakdown.

In view of above, to overcome the drawbacks in the prior art, the present invention proposes a DMOS device and a manufacturing method thereof, wherein the ESD effect of the DMOS device is mitigated, so that the DMOS device may have a broader application range.

SUMMARY OF THE INVENTION

A first objective of the present invention is to provide a double diffused metal oxide semiconductor (DMOS) device.

A second objective of the present invention is to provide a manufacturing method of a DMOS device.

To achieve the objectives mentioned above, from one perspective, the present invention provides a double diffused metal oxide semiconductor (DMOS) device, including: a first conductive type substrate, which has an upper surface; a second conductive type high voltage well, which is formed in the substrate below the upper surface; a gate, which is formed on the upper surface, wherein at least part of the gate is located in the high voltage well from top view, and the gate has a first side and a second side opposite to each other in a vertical direction; a first conductive type body region, which is formed in the high voltage well below the upper surface, wherein at least part of the body region is located outside the first side; a source and a drain with second conductive type, which are formed below the upper surface outside the gate, the source being located in the body region outside the first side, and the drain being located outside the second side, wherein the drain and the gate are separated by the high voltage well, and when the DMOS device turns ON, a lateral channel is formed between the source and the drain below the upper surface; a first conductive type body electrode, which is formed in the body region below the upper surface as an electrically contact of the body region; and a first conductive type floating region, which is formed in the body region below the upper surface, wherein the floating region is electrically floating and electrically isolated from the source and the gate.

From another perspective, the present invention provides a manufacturing method of a double diffused metal oxide semiconductor (DMOS) device, including: providing a first conductive type substrate, which has an upper surface; forming a second conductive type high voltage well in the substrate below the upper surface; forming a gate on the upper surface, wherein at least part of the gate is located in the high voltage well from top view, and the gate has a first side and a second side opposite to each other in a vertical direction; forming a first conductive type body region in the high voltage well below the upper surface, wherein at least part of the body region is located outside the first side; forming a source and a drain with second conductive type below the upper surface outside the gate, the source being located in the body region outside the first side, and the drain being located outside the second side, wherein the drain and the gate are separated by the high voltage well, and when the DMOS device turns ON, a lateral channel is formed between the source and the drain below the upper surface; forming a first conductive type body electrode in the body region below the upper surface as an electrically contact of the body region; and forming a first conductive type floating region in the body region below the upper surface, wherein the floating region is electrically floating and electrically isolated from the source and the gate.

In one preferable embodiment, the floating region is located outside one vertical end of the source from top view, and is directly or not directly in contact with the source.

In another preferable embodiment, the floating region separates the source to a first source and a second source in the vertical direction, and the floating region and the source are separated by part of the body region.

In the aforementioned embodiment, the DMOS device may be a double diffused drain metal oxide semiconductor (DDDMOS) device or a lateral double diffused metal oxide semiconductor (LDMOS) device.

In one another preferable embodiment, the floating region and the body electrode are formed by a same process step.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 3A:
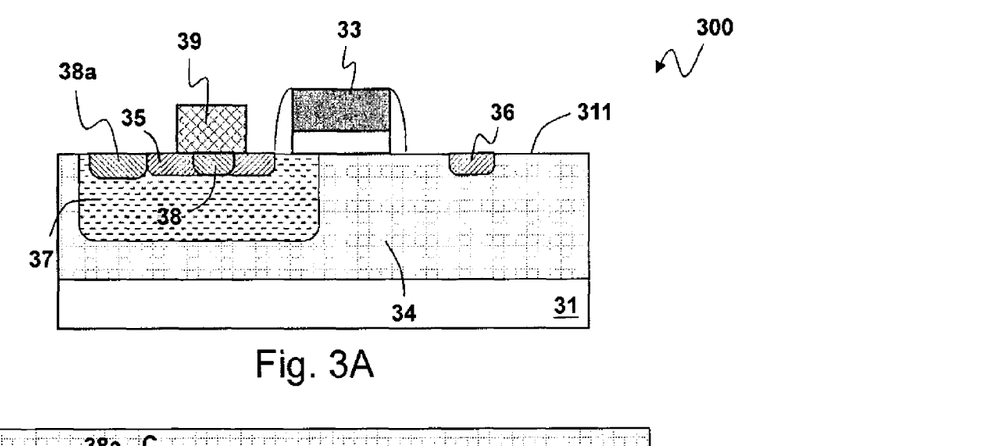
FIGS. 3A-3B show a first embodiment of the present invention.
Figure 3B:
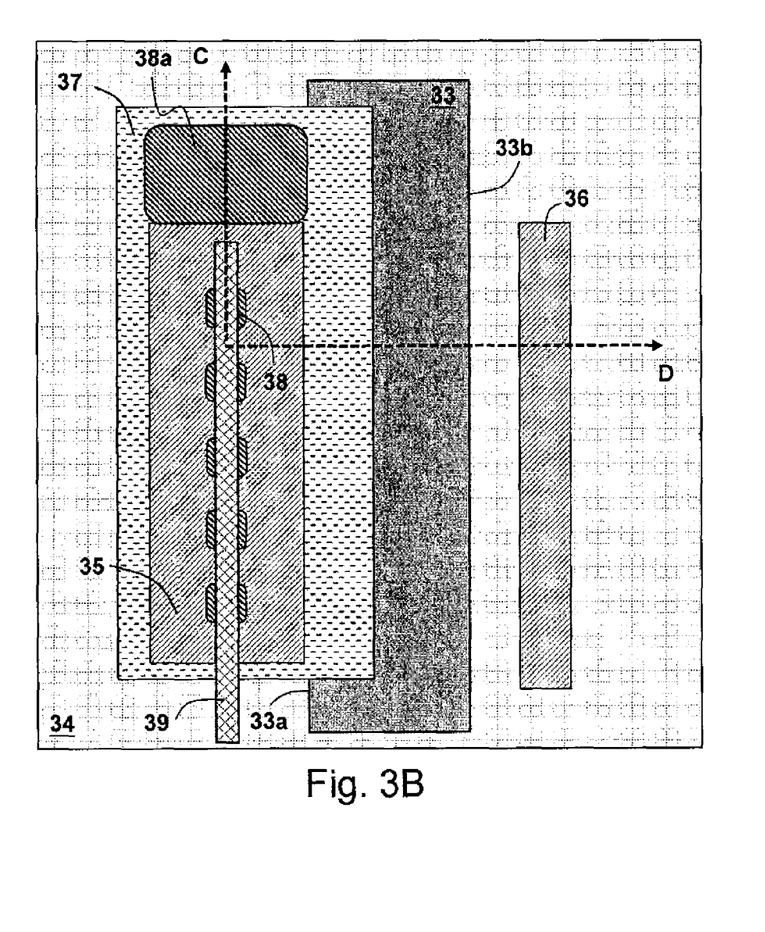

FIGS. 3A and 3B are schematic diagrams of a DDDMOS device 300 according to a first embodiment of the present invention from cross-section and top view, wherein FIG. 3A shows the cross-section view taken along a cross-section line CD of the top view shown in FIG. 3B. As shown in the figures, the DDDMOS device 300 includes a substrate 31, a gate 33, an N-type high voltage well 34, an N-type source 35, an N-type drain 36, a P-type body region 37, a P-type body electrode 38, and a P-type floating region 38a. The substrate 31 for example is P-type but not limited to P-type, and the substrate 31 has an upper surface 311. The gate 33 is formed on the upper surface 311. The N-type high voltage well 34, the N-type source 35, and the N-type drain 36 are formed below the upper surface 311 in the substrate 31. The N-type high voltage well 34, the N-type source 35, and the N-type drain 36 are defined by lithography process steps and formed by ion implantation process steps, wherein the lithography process step defines the implantation region by a photoresist mask together with a self-alignment effect provided by all or part of the gate 33, and the ion implantation process step implants N-type impurities to the defined region in the form of accelerated ions. The P-type body region 37, the P-type body electrode 38, and the P-type floating region 38a are formed below the upper surface 311 and defined by lithography process steps and formed by ion implantation process steps, wherein the lithography process step defines the implantation region by a photoresist mask together with a self-alignment effect provided by all or part of the gate 33 and the field oxide region 12, and the ion implantation process step implants P-type impurities to the defined region in the form of accelerated ions. The source 35 and the drain 36 are below the gate 33 and at different sides thereof respectively. At least part of the gate 33 is located in the high voltage well 34 from the top view FIG. 3B, and the gate 33 has a first side 33a and a second side 33b opposite to each other in the vertical direction. The body region 37 is formed in the high voltage well 34 below the upper surface 311, wherein at least part of the body region 37 is located outside the first side 33a. The source 35 and the drain 36 are formed below the upper surface 311 outside the gate 31. The source 35 is located in the body region 37 outside the first side 33a, and the drain 36 is located outside the second side 33b. The drain 36 and the gate 33 are separated by the high voltage well 34. When the DMOS device 300 turns ON, a lateral channel (not shown) is formed between the source 35 and the drain 36 below the upper surface 311. The body electrode 38 is formed in the body region 37 below the upper surface 311 as an electrically contact of the body region 37.

This embodiment is different from the prior art in that, in this embodiment, the DDDMOS device 300 has the floating region 38a formed in the body region 37 below the upper surface 311, wherein the floating region 38a is electrically floating and electrically isolated from the source 35 and the gate 33, i.e., the floating region 38a has an independent voltage level which is not directly related to the voltage levels of the source 35 and the gate 33.

The arrangement of the floating region 38a in this embodiment of the present invention is advantageous in that, first, the floating region 38a and the body electrode 38 may be (but not limited to) formed in the substrate 31 by a same process step without any additional mask or process step, such that the manufacturing cost can be reduced; second, more importantly, when the DDDMOS device 300 electrically contacts a high voltage ESD, because of the floating region 38a, the channel of the DDDMOS device 300 can be fully turned ON to release the high voltage ESD before the high voltage ESD damages the DDDMOS device 300, such that the ESD effect is mitigated.

Figure 4:
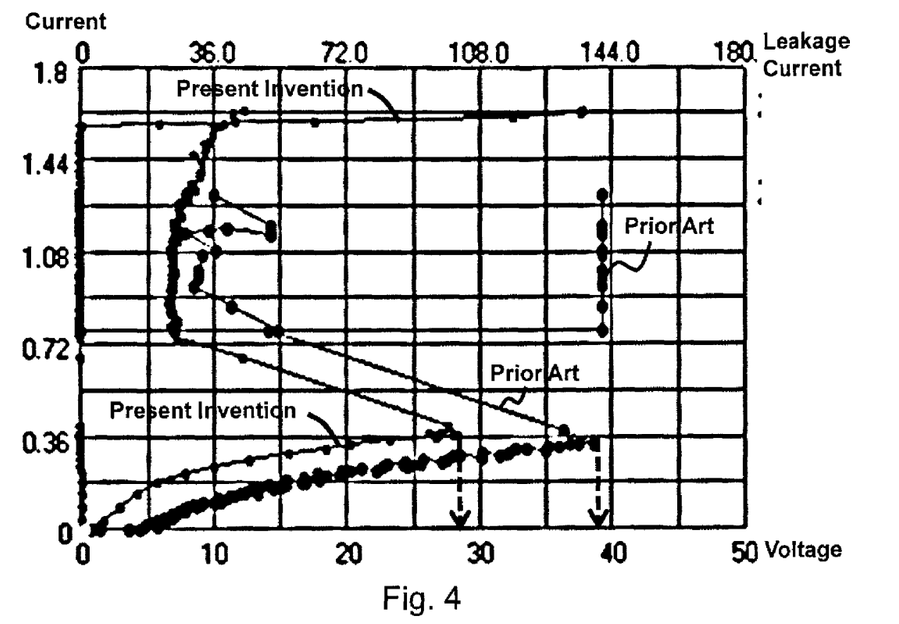
FIG. 4 shows current-voltage characteristic curves of DMOS devices of the prior art and the present invention obtained by a transmission-line pulse ESD test.

FIG. 4 shows current-voltage characteristic curves obtained by a transmission-line pulse ESD test of the present invention and a prior art DMOS device. Referring to FIG. 4, the prior art DMOS device has a trigger voltage of about 40V, which is higher than the trigger voltage of the DMOS device of the present invention (about 30V); this means that the DMOS device of the present invention turns ON earlier when an electrostatic voltage is applied, so the ESD effect is mitigated in the present invention as compared with the prior art. Besides, the ESD breakdown voltage, i.e., the voltage causing an obvious leakage current, of the present invention is higher than the prior art DMOS device. Therefore, the DMOS device of the present invention can sustain a higher electrostatic voltage and a higher electrostatic current. The above shows that the present invention is advantageous over the prior art.

Figure 5A:
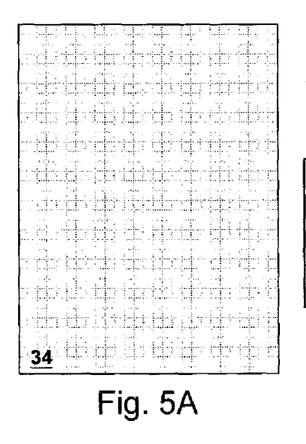
FIGS. 5A-5L show a second embodiment of the present invention.
Figure 5B:
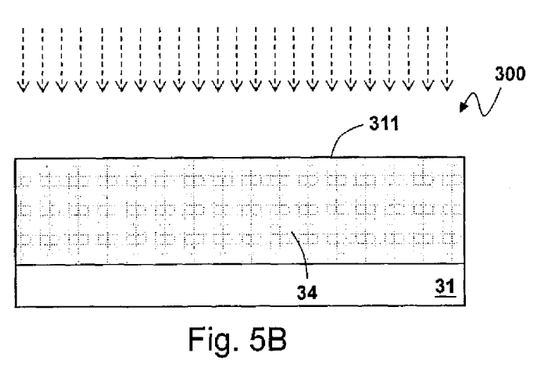

Please refer to FIGS. 5A-5L for a second embodiment according to the present invention, wherein FIGS. 5A-5L are schematic diagrams showing a manufacturing method of the DDDMOS device 300 according to the present invention. To be illustrative, top views and cross-section views are shown at left and right sides in contrast with each other. As shown in FIGS. 5A and 5B, the substrate 31 with the upper surface 311 is provided, which has for example but not limited to the P-type conductivity. As shown in the figure, in the P-type substrate 31 below the upper surface 311, the N-type high voltage well 34 is formed.

Figure 5C:
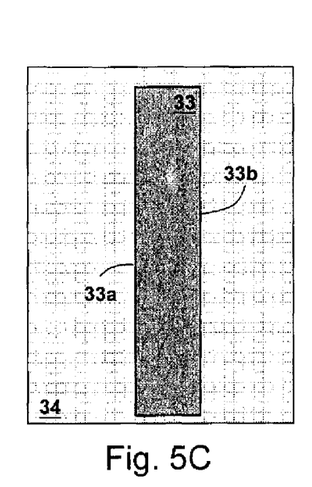
Figure 5D:
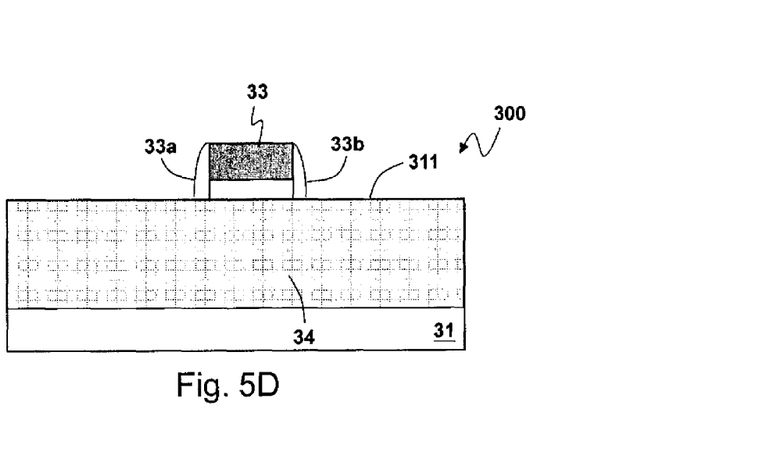

Next, as shown in FIGS. 5C and 5D, the gate 33 is formed on the upper surface 311. From the top view FIG. 5C, the gate 33 is located in the high voltage well 34, wherein the gate 33 has the first side 33a and the second side 33b opposite to each other in the vertical direction.

Figure 5E:
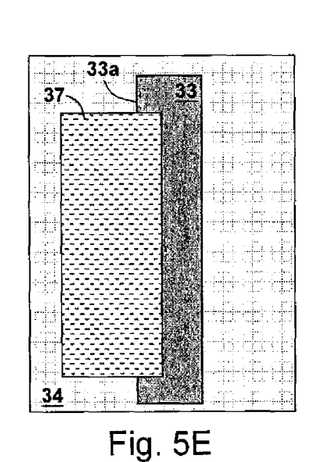
Figure 5F:
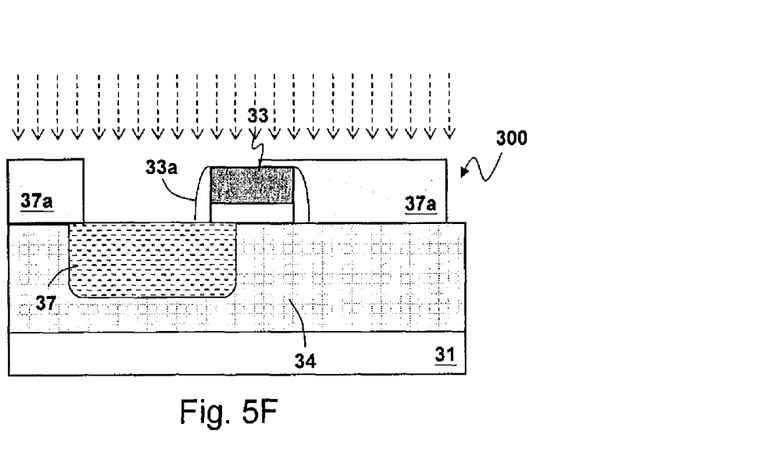

Next, as shown in FIGS. 5E and 5F, the body region 37 is defined by a lithography process step with for example but not limited to a photoresist mask 37a together with a self-alignment effect provided by part of the gate 33, and an ion implantation process step implants P-type impurities to the defined region in the N-type high voltage well 34 in the form of accelerated ions as indicated by the dashed arrow lines. Part of the P-type impurities will diffuse to the gate 33 below, to form a P-type region of the channel. Therefore, part of the body region 37 is below the gate 33 and other part of the body region 37 is outside the first side 33a.

Figure 5G:
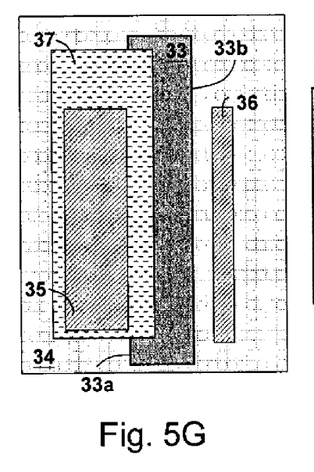
Figure 5H:
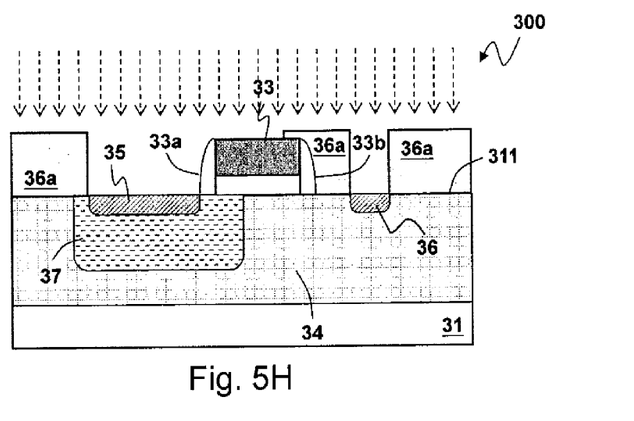

Next, as shown in FIGS. 5G and 5H, by the same or different process steps, the N-type source 35 and drain 36 are defined by a lithography process step with for example but not limited to a photoresist mask 36a together with a self-alignment effect provided by part of the gate 33, and an ion implantation process step implants N-type impurities to the defined regions in the P-type body region 37 and the N-type high voltage well 34 respectively, in the form of accelerated ions as indicated by the dashed arrow lines. The source 35 is located in the body region 37 outside the first side 33a, and the drain 36 is located outside the second side 33b, and the drain 36 and the gate 33 are separated by the high voltage well 34 (so the source 35 and the drain 36 are further separated). When the DMOS device 300 turns ON, a lateral channel (not shown) is formed between the source 35 and the drain 36 below the upper surface 311.

Figures 5I, 5J:
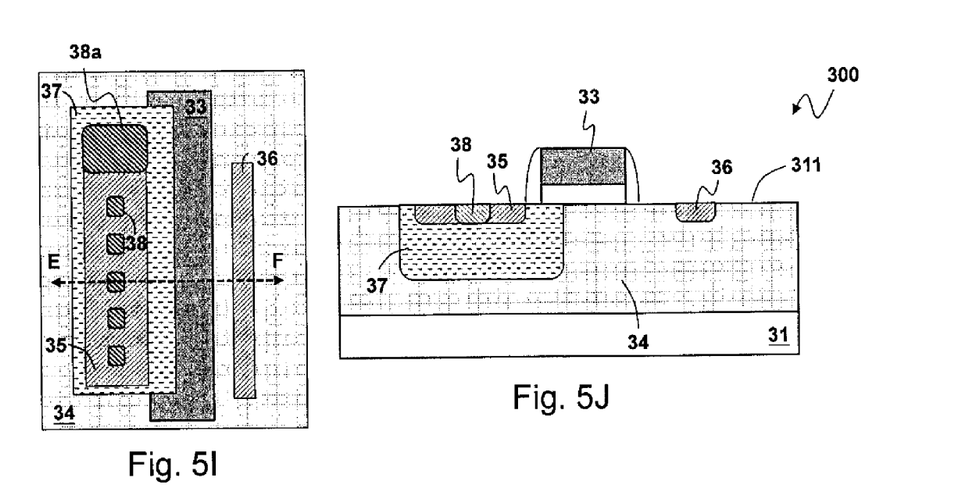

Next, as shown in FIGS. 5I and 5J, the P-type body electrode 38 and the P-type floating region 38a are formed by the same or different process steps in the body region 37 below the upper surface 311, wherein the floating region 38a is electrically floating and electrically isolated from the source 35 and the gate 33. (FIG. 5J is a cross-section view taken along a cross-section line EF in the top view FIG. 5I, so FIG. 5J does not show the floating region 38a.)

Note that the P-type body electrode 38 and the P-type floating region 38a are formed by, for example but not limited to, the same ion implantation process step. In this embodiment, as shown in FIG. 5I, the floating region 38a is formed, for example but not limited to, outside the source 35 in the vertical direction and in contact with the source 35.

Figure 5K:
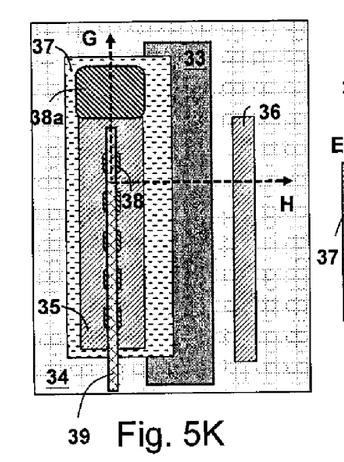
Figure 5L:
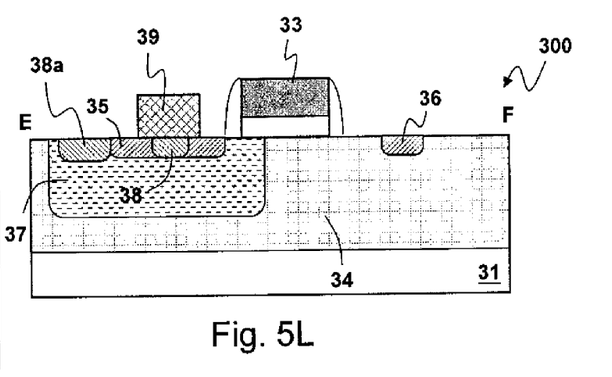

Next, FIGS. 5K and 5L show a top view and a cross-section view taken along a cross-section line GH in the top view of the DDDMOS device 300, respectively. In the DDDMOS device 300, a conductive layer 39 which connects the source 35 and the body region 38 is formed, such that the source 35 and the body region 37 are electrically connected. Certainly, this arrangement is only one of the embodiments, and the present invention is not limited to this arrangement. For example, the source 35 and the body electrode may connect to different conductive layers respectively, such that the source 35 and the body region 37 are not electrically connected. The latter arrangement also belongs to the scope of the present invention. Note that the conductive layer 39 does not connect to the floating region 38a, such that the voltage level of the floating region 38a is unaffected and remains floating.

Figure 6A:
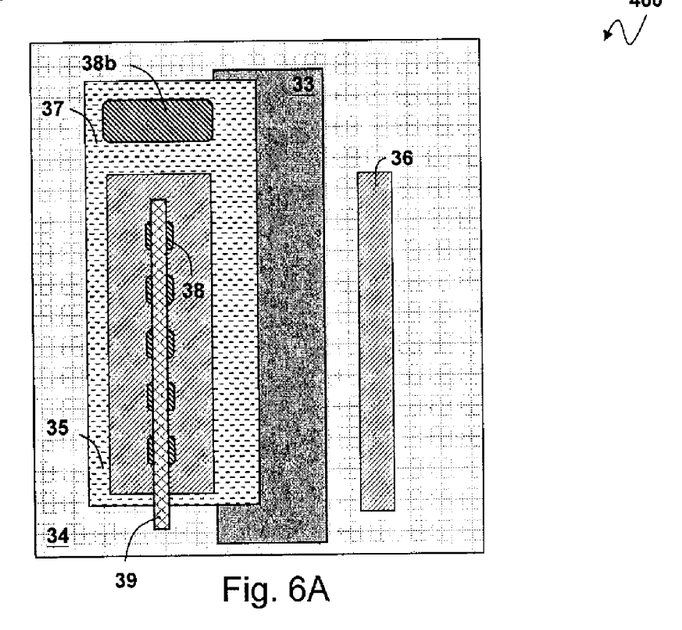
FIGS. 6A-6C show a third, a fourth, and a fifth embodiments of the present invention, respectively.
Figure 6B:
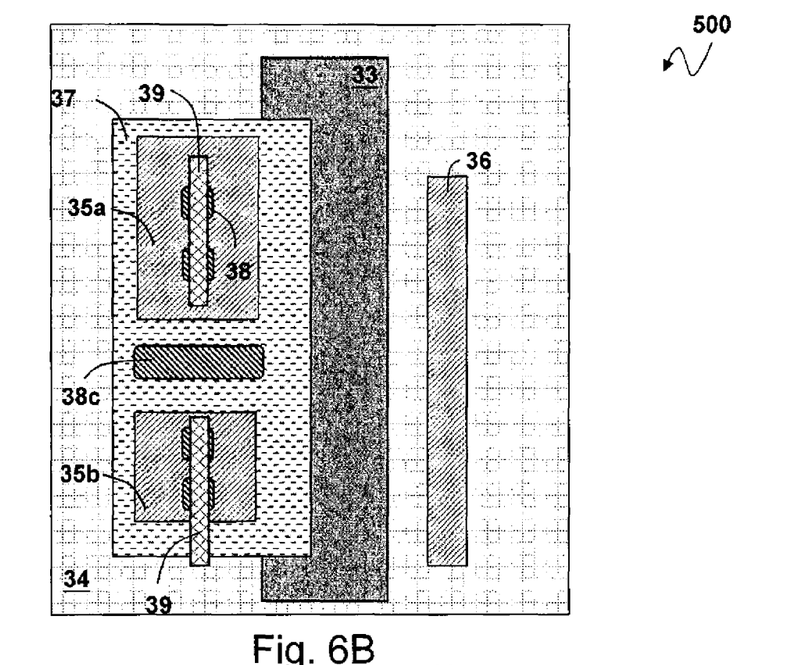
Figure 6C:
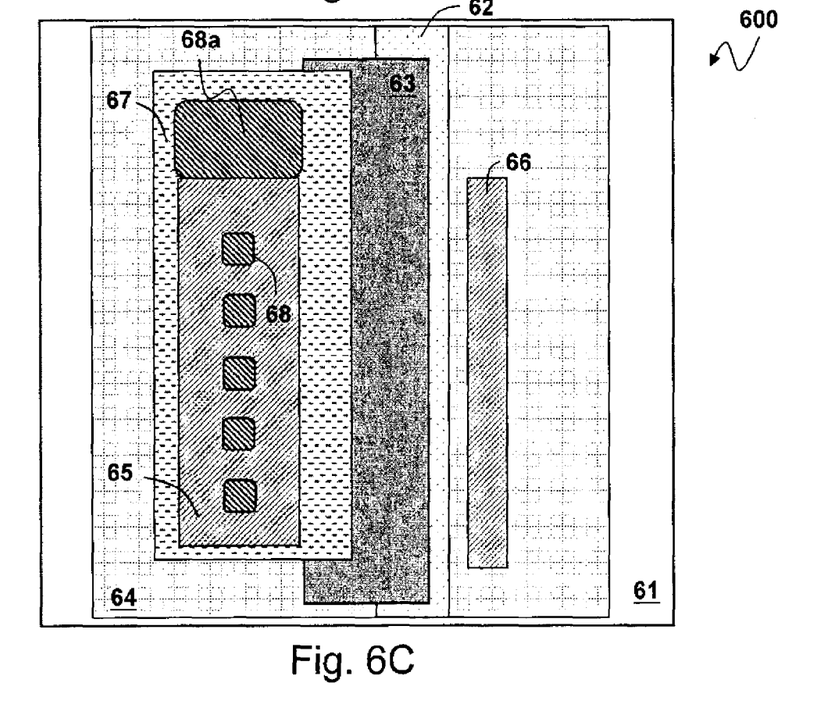

FIGS. 6A-6C show a third, fourth, and a fifth embodiments of the present invention, respectively, to show that the floating region of the present invention may be embodied in various different forms. Referring to FIG. 6A, this embodiment is different from the first embodiment in that, a floating region 38b of a DDDMOS device 400 is located outside the source 35 in the body region 37 in the vertical direction from top view FIG. 6A, and is not in contact to the source 35. FIG. 6B shows the fourth embodiment of the present invention. This embodiment is different from the first embodiment in that, a floating region 38c of a DDDMOS device 500 separates the source 35 to a first source 35a and a second source 35b in the vertical direction as shown by the top view FIG. 6B, and the floating region 38c and the source 35 are separated by part of the body region 37. Although the first source 35a and the second source 35b are separated, they may be electrically connected by one or more conductive layers (not shown) electrically connecting the separated conductive layers 39.

FIG. 6C shows the fifth embodiment of the present invention. This embodiment shows that the present invention maybe applied in an LDMOS device 600. As shown in the figure, the LDMOS device 600 includes: a substrate 61, a field oxide region 62, a gate 63, an N-type high voltage well 64, an N-type source 65, an N-type drain 66, a P-type body region 67, a P-type body electrode 68, and a P-type floating region 68a. The substrate 61 is for example but not limited to P-type. The N-type high voltage well 64, the N-type source 65, and the N-type drain 66 are formed by lithography process steps and ion implantation process steps, wherein the lithography process step defines the implantation region by a photoresist mask together with a self-alignment effect provided by all or part of the gate 63 with the field oxide region 62, and the ion implantation process step implants N-type impurities to the defined region in the form of accelerated ions. The P-type body region 67, the P-type body electrode 68, and the P-type floating region 68a are formed by lithography process steps and ion implantation process steps, wherein the lithography process step defines the implantation region by a photoresist mask together with a self-alignment effect provided by all or part of the gate 63 with the field oxide region 62, and the ion implantation process step implants P-type impurities to the defined region in the form of accelerated ions. The source 65 and the drain 66 are below the gate 63 and at different sides thereof respectively. The source 65 and the gate 63 are separated by the high voltage well 64. The source 65, the body electrode 68, and the floating region 68a are formed in the body region 67.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography, X-ray lithography, etc.; for another example, in all the aforementioned embodiments, the conductive type of each region is not limited to P-type, such as the body region, the body electrode, and the floating region, etc. (or N-type, such as the high voltage well, the source, and the drain, etc.), but it may be changed to N-type (or P-type) with conductive type and/or impurity concentration modifications in other regions; for another example, the present invention is not limited to be applied in the DDDMOS device or the LDMOS device, but may be applied in other high voltage devices. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A double diffused metal oxide semiconductor (DMOS) device, comprising:
    a first conductive type substrate, which has an upper surface;
    a second conductive type high voltage well, which is formed in the substrate below the upper surface;
    a gate, which is formed on the upper surface, wherein at least part of the gate is located in the high voltage well from top view, and the gate has a first side and a second side opposite to each other in a vertical direction;
    a first conductive type body region, which is formed in the high voltage well below the upper surface, wherein at least part of the body region is located outside the first side;
    a source and a drain with the second conductive type, which are formed below the upper surface outside the gate, the source being located in the body region outside the first side, and the drain being located outside the second side, wherein the drain and the gate are separated by the high voltage well, and when the DMOS device turns ON, a lateral channel is formed between the source and the drain below the upper surface;
    a first conductive type body electrode, which is formed in the body region below the upper surface as an electrical contact of the body region; and
    a first conductive type floating region, which is formed in the body region below the upper surface, wherein the floating region has a voltage level which is isolated from voltage levels of the source and the gate;
    wherein the floating region separates the source to a first source and a second source in the vertical direction, and the floating region and the source are separated by part of the body region.

2. The DMOS device of claim 1, wherein the DMOS device is a double diffused drain metal oxide semiconductor (DDDMOS) device or a lateral double diffused metal oxide semiconductor (LDMOS) device.

3. The DMOS device of claim 1, wherein the floating region and the body electrode are formed by a same process step.

* * * * *